United States Patent [19]
Amor et al.

[11] Patent Number: 5,786,695
[45] Date of Patent: Jul. 28, 1998

[54] SHIM TRAY WITH REDUCED HEAT CONDUCTION AND FORCED COOLING

[75] Inventors: William H. Amor, Chagrin Falls; Jerome S. Alden, Reminderville; Gordon D. DeMeester, Wickliffe; James L. Gruden, Kirtland Hills; Junxiao Ling, University Heights, all of Ohio

[73] Assignee: Picker International, Inc., Highland Heights, Ohio

[21] Appl. No.: 822,766

[22] Filed: Mar. 21, 1997

[51] Int. Cl.⁶ .................................................. G01V 3/00
[52] U.S. Cl. ........................................ 324/320; 324/319
[58] Field of Search ................................ 324/320, 319, 324/318, 309, 307, 314, 300; 128/653.5; 335/216, 299, 298, 297

[56] References Cited

U.S. PATENT DOCUMENTS

| | | | |
|---|---|---|---|
| 4,771,244 | 9/1988 | Vermilyea | 324/320 |
| 5,323,136 | 6/1994 | Oue et al. | 324/320 |
| 5,349,297 | 9/1994 | DeMeester et al. | 324/318 |
| 5,389,909 | 2/1995 | Havens | 324/320 |
| 5,532,597 | 7/1996 | McGinley et al. | 324/319 |
| 5,550,472 | 8/1996 | Richard et al. | 324/320 |
| 5,623,430 | 4/1997 | Dorri | 324/320 |

*Primary Examiner*—Louis M. Arana
*Attorney, Agent, or Firm*—Fay, Sharpe, Beall, Fagan, Minnich & McKee

[57] ABSTRACT

The magnetic field assembly of a magnetic resonance imaging device includes an annular superconducting magnet (10) which is mounted within a toroidal vacuum vessel (24). Two cylindrical members (26, 46) define an annular gap (58). A shim set (60) for shimming the uniformity of the magnetic field is mounted in the gap (58). The shim set includes a plurality of shim trays (62), each of which defines a plurality of shim receiving pockets (64). A bottom wall (81) of each pocket is spaced from the cylindrical member (26) by side walls (76) and feet (78) to minimized heat flow. Shim tray covers (68) have flanges (90) and narrow contact surfaces (94) which are cammed against surfaces (61) of spacers (56) to press the cover on the tray and the tray feet against the cylinder (26) while minimizing heat flow through the spacers to the shims.

19 Claims, 6 Drawing Sheets

SHIM TRAY WITH REDUCED HEAT CONDUCTION AND FORCED COOLING

BACKGROUND OF THE INVENTION

The present invention relates to the magnetic resonance art. It finds particular application in conjunction with shielded gradient coil assemblies for magnetic resonance imaging apparatus and will be described with particular reference thereto. However, it will be appreciated that the present invention will also find application in conjunction with magnetic resonance spectroscopy systems and other applications which require RF fields and gradient magnetic fields.

Magnetic Resonance Imaging (MRI) systems typically include a superconducting magnet which generates a temporally constant primary magnetic field. The superconducting magnet is encased within a toroidal vacuum vessel or dewar that includes a central cylindrical bore through which the primary magnetic field is generated. As generated, the primary magnetic field commonly has limited non-uniformities.

It is known to use active or passive shims to correct the non-uniformities and render the primary magnetic field substantially uniform within the bore. Although active shims in the form of resistive coils are sometimes used, passive shims in the form of small pieces of steel about a few centimeters square and a millimeter or less thick are more common.

There are several important subsystems of the MRI system that are placed within the cylindrical bore of the primary magnet. For instance, a set of coils forming a gradient coil structure generates the x, y, and z-gradient fields used for MRI. Within a bore of the gradient coil structure is an RF coil and the object to be imaged. One of the difficulties is that the gradient magnetic fields generated for the MRI also induces eddy currents in the magnet structure. The eddy currents in turn produced their own magnetic fields thus interfering with the imaging process.

Self-shielded gradients have been developed which eliminate eddy currents. A self-shielded gradient consists of a set of primary x, y, and z-coils forming an inner or primary gradient coil assembly and an additional set of x, y, and z-coils forming an outer or secondary gradient coil assembly spaced at a larger radius from the primary gradient coil assembly. The geometry of the coils is chosen such that when the coils are excited in series, they have substantially no residual gradient field outside of the outer coils. Within the inner radius, the combination of primary and secondary coils produces a substantially linear gradient along a respective one or more of the x, y, or z axis.

A larger separation between the inner and outer coils of a shielded gradient results in more efficient gradient field generation. However, the cost of a large bore superconducting magnet is generally more than a smaller magnet. Thus, minimizing system cost dictates minimizing the patient bore, hence, minimizing spacing between the inner and outer coils.

It is known to position shims within the gap separating the inner gradient coil from the outer gradient coil (see U.S. Pat. No. 5,349,297, issued to DeMeester on Sep. 20, 1994). One difficulty is that the shims are susceptible to the heat generated by the joule losses of the gradient tubes. In particular, the magnetic characteristics of the shims vary with temperature, altering the compensation which the shims make to the primary magnetic field. As imaging methods become faster, the accuracy of the shimming becomes more important.

The present invention provides a new and improved shim set which overcomes the above-referenced problems and others.

SUMMARY OF THE INVENTION

In accordance with the present invention, a shim set for use in a magnetic resonance imaging apparatus includes a main field magnet for generating a temporally constant magnetic field through an examination region, a radio frequency transmitter for exciting and manipulating magnetic resonance in selected dipoles in the examination region, a receiver for demodulating magnetic resonance signals received from the examination region, a processor for reconstructing the demodulated resonance signals into an image representation, and a self-shielded gradient coil assembly including a primary gradient coil and a secondary gradient coil coupled together to cause magnetic field gradients along first, second, and third axes within the examination region and shield at least selected regions outside the examination region from magnetic field gradients. The shim set includes an elongate shim tray positioned within an annular gap defined between the primary and secondary gradient coils. The shim tray includes a pocket for retaining a shim therein. The pocket is spaced apart from an inner periphery of the secondary gradient coil to define a cooling passage therebetween. A cover is secured to the tray for retaining the shim within the pocket.

In accordance with a second aspect of the present invention, a magnetic resonance apparatus includes a magnet assembly for generating a temporally constant magnetic field along a longitudinal axis through an examination region. The magnet assembly includes a generally cylindrical member which defines a longitudinally extending bore which extends around the examination region. A radio frequency coil assembly is disposed within the bore for transmitting radio frequency pulses into the examination region. A gradient coil assembly for causing magnetic field gradients within the bore includes a shield gradient coil assembly supported by the cylindrical member, a primary gradient coil assembly supported within the first gradient coil assembly, and a shimming assembly supported between the primary gradient coil assembly and the cylindrical member for adjusting the magnetic field through the examination region. The shimming assembly includes an elongate shim tray positioned within an annular gap defined between the primary and secondary gradient coils. The shim tray includes a pocket for retaining a shim therein. The pocket is spaced apart from an inner periphery of the shield gradient coil to define a cooling passage therebetween. A cover is secured to the tray for retaining the shim within the pocket.

One advantage of the present invention is that it minimizes the effect that heat conduction has on a shim set thus allowing quality images.

Another advantage of the present invention is that it improves the efficiency of the shim set in correcting various orders of magnetic field inhomogeneities.

Another advantage of the present invention resides in the low cost of manufacture.

Another advantage of the present invention is that the shim set is integrated into a self shielded gradient coil.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
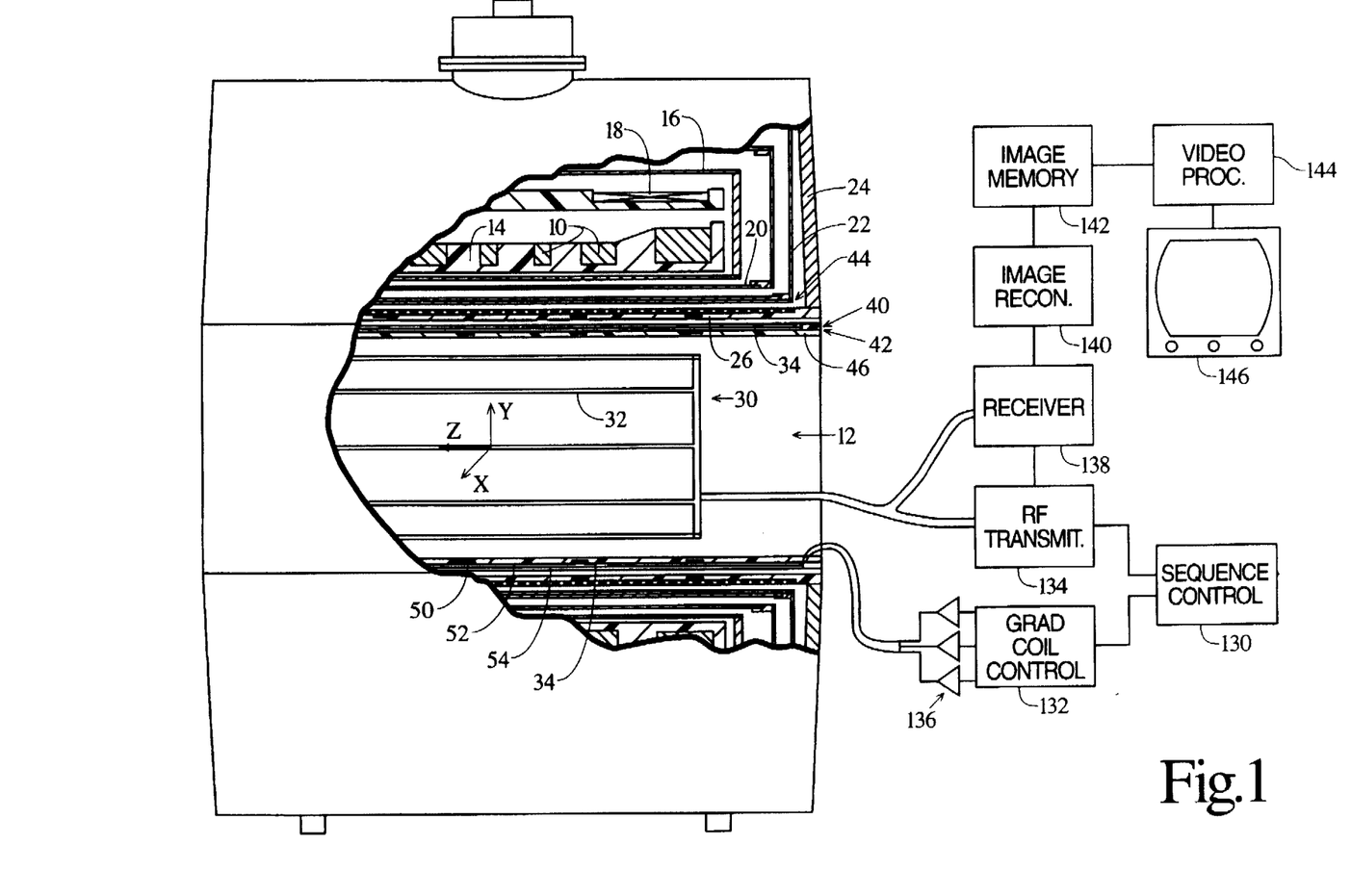
FIG. 1 is a diagrammatic illustration of a magnetic resonance imaging system in accordance with the present invention.

With reference to FIG. 1, a plurality of superconducting magnetic field coils 10 generate a temporally constant magnetic field along a longitudinal or z-axis of a central bore 12. The x and y-axes are defined orthogonal to the z-axis and each other, e.g. horizontally and vertically. The coils of the superconducting magnet are supported by a former 14 and are received in a toroidal helium vessel or can 16. The helium vessel is filled with liquid helium to maintain the superconducting magnet at a temperature at which it is superconducting. A main magnetic field shield coil assembly 18 shields regions surrounding the superconducting magnet from the full strength of the main magnetic field.

To reduce helium boil-off, the toroidal helium vessel 16 is surrounded by a first cold shield 20 which is maintained at about 20° K. or less. A second cold shield assembly 22 is chilled to about 60°–70° K. or less. The first and second cold shields are preferably cooled by mechanical refrigeration (not shown). A toroidal vacuum vessel 24 encases the cold shields to define a vacuum reservoir therearound. The vacuum vessel 24 includes a cylindrical member 26 that defines the bore 12 and extends parallel to the z-axis. The main magnetic field is generated through the cylindrical member 26. Preferably, layers of aluminized Mylar insulation are arranged between the vacuum vessel and the cold shields.

Figure 2:
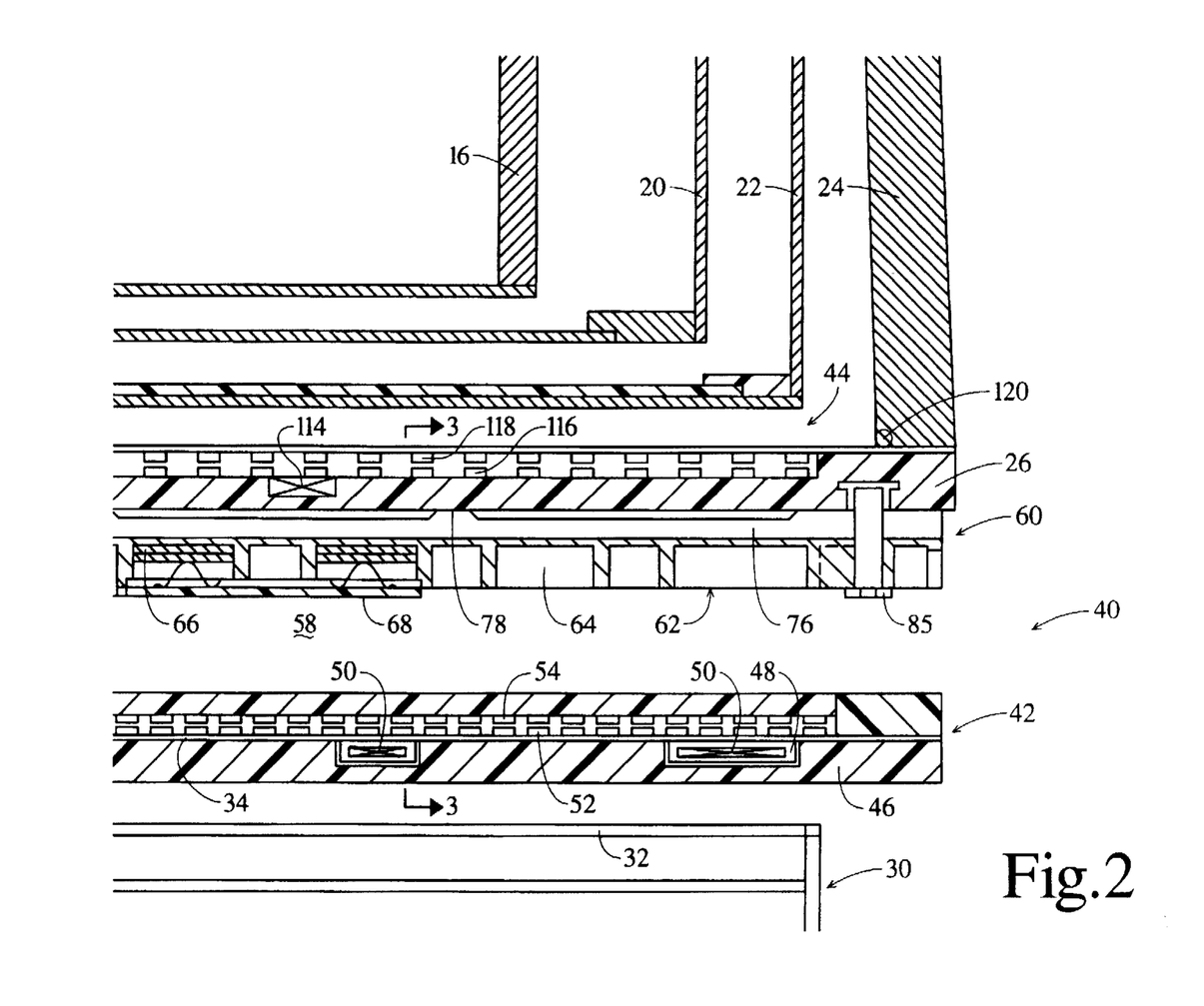
FIG. 2 is an enlarged, cross-sectional view of a shim set mounted between a primary gradient coil and a shield gradient coil of the magnetic resonance imaging system of FIG. 1.

With continuing reference to FIG. 1 and further reference to FIG. 2, an RF coil assembly 30 is mounted in the bore 12. More specifically, the RF coil assembly includes an RF coil 32 and an RF shield 34. The RF coil 32, preferably a quadrature or birdcage type coil, has an inner diameter which defines a patient receiving bore, preferably of at least 55 cm.

A gradient coil assembly 40 includes a primary whole body gradient coil assembly 42 and a secondary coil assembly 44. The primary gradient coil assembly 42 includes a cylindrical dielectric former 46. Preferably, the former has a sufficient thickness to maintain its structural integrity under the forces associated with generating the magnetic field gradients, e.g. 5–10 mm of glass reinforced plastic, preferably about 7.5 mm. The former 46 has a series of grooves 48 defined or cut in its outer surface in accordance with the pattern of a z-gradient coil 50.

The RF shield 34, preferably a fine copper mesh, is applied to the outer surface of the former 46 and through the z-coil receiving grooves 48. The RF shield mesh may be deformed into the grooves by tightly wound z-gradient wire windings, may be fitted into the grooves, may have solder connected segments extending through the grooves, or the like. The grooves 48 have a depth which generally corresponds to the thickness of the z-gradient coils such that after the z-gradient coils are inserted, a substantially circularly cylindrical surface is presented for receiving x and y-gradient coils 54, 52.

The x and y-gradient coils 54, 52 are preferably fingerprint-type coils as illustrated in greater detail in U.S. Pat. No. 5,296,810 which issued to Morich on Mar. 22, 1994, and assigned to the same assignee as the present invention. Due to the circular symmetry, the x and y-gradient coils are substantially identical, but offset 90° relative to each other and scaled to a corresponding radius. The x and y-gradient coils, the RF shield, and the z-gradient coils are potted in an epoxy or other dielectric material. The woven screen RF shield and the fingerprint type coils are advantageous in the potting process because they provide paths for the potting material flow.

Various alternate constructions are also contemplated. First, grooves need not be provided for the z-gradient coil. Rather, the z-gradient coil 50 may be laminated in a layer on top of the RF shield 34. Second, if grooves 48 are provided for the z-gradient coil, strips of foil or other RF shield material may be laid in the grooves and a continuous sheet or strips of the RF mesh or other RF shield may be wound over the z-coil. Solder connections or the like provide electrical continuity between the strips inserted under the z-gradient coil and the remainder of the RF shield. Third, the z-gradient coil may be individual windings, a cluster or bunched coil, or a distributed coil. Fourth, by winding the z-gradient coil under tension, the RF shield screen can be deformed into the grooves eliminating the soldering.

Other RF shields 34 are also contemplated, such as a thin electrically conductive layer that is electro-deposited or sputtered. The RF screen may also include lapped segments of mesh or copper film. The RF screen may also be mounted on the outer or inner surface of the cylindrical former 46.

Figure 3:
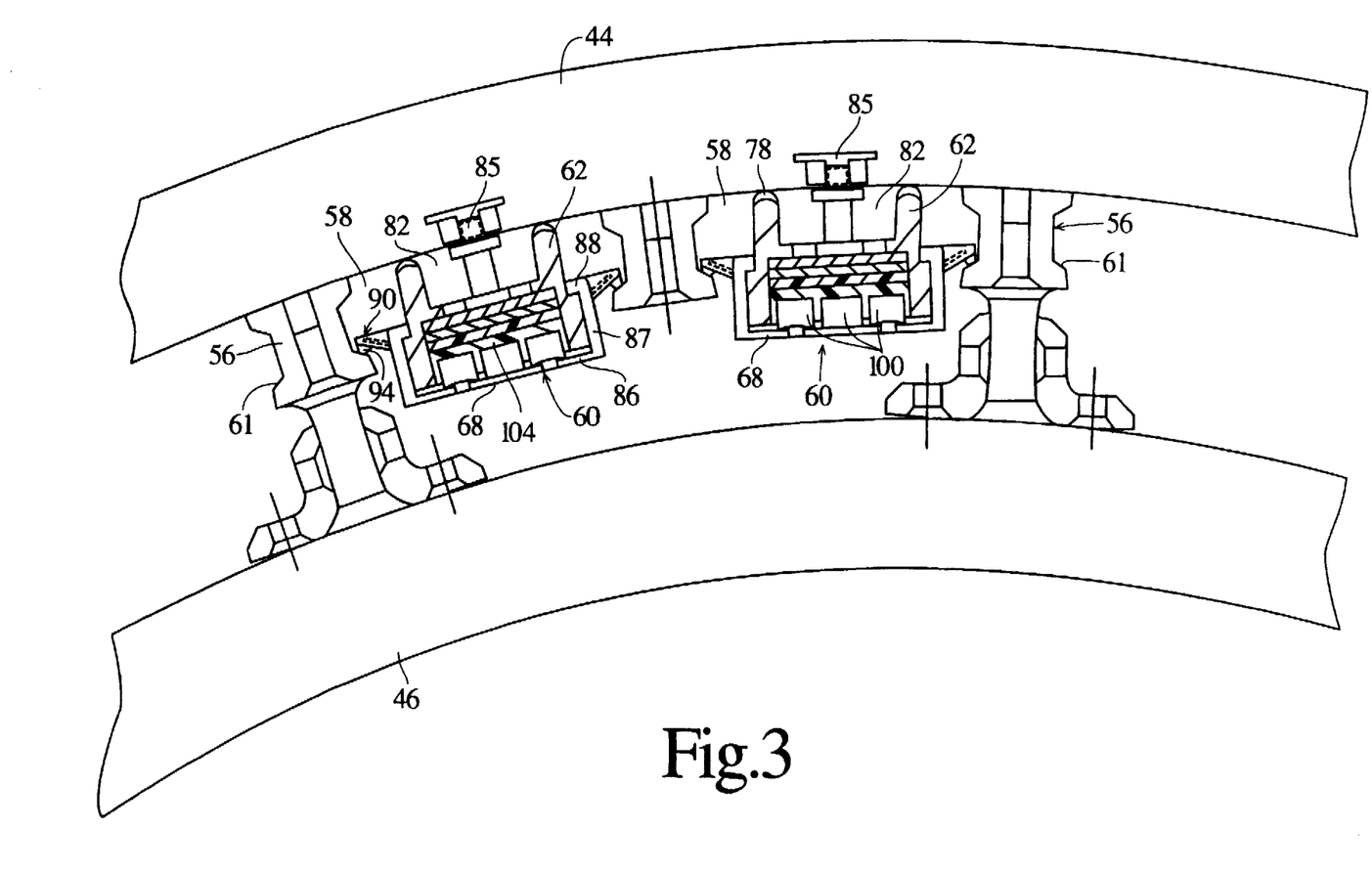
FIG. 3 is a sectional view taken along the line 3—3 of FIG. 2.

With continuing reference to FIG. 2, and further reference to FIG. 3, the cylindrical member 26 is spaced concentrically apart from the gradient former 46 to define an annular area therebetween. A plurality of plastic I-beams or other mounting brackets 56 are circumferentially spaced-apart within the annular area between the gradient former 46 and the cylindrical member 26. Adjacent I-beams 56 define gaps or passages 58 of sufficient size to receive lower order magnet field shim sets 60. The I-beams 56 include flanges 61 which project in circumferential directions within the gaps 58.

The shim sets 60 each include a longitudinally elongated dielectric shim tray 62 that defines a plurality of pockets 64 for receiving shims or ferrous elements 66. The ferrous elements are preferably thin sheets of steel. The shims are held in the shim pockets by removable shim tray covers 68 that are secured to the shim tray 62 as described further below.

Figure 4:
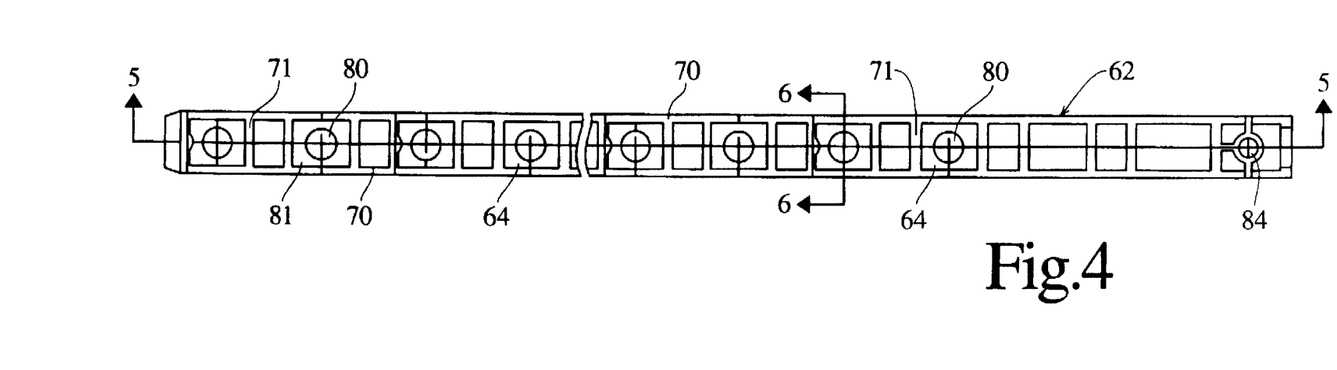
FIG. 4 is a top view of a shim tray of the shim set of FIG. 2.
Figure 5:
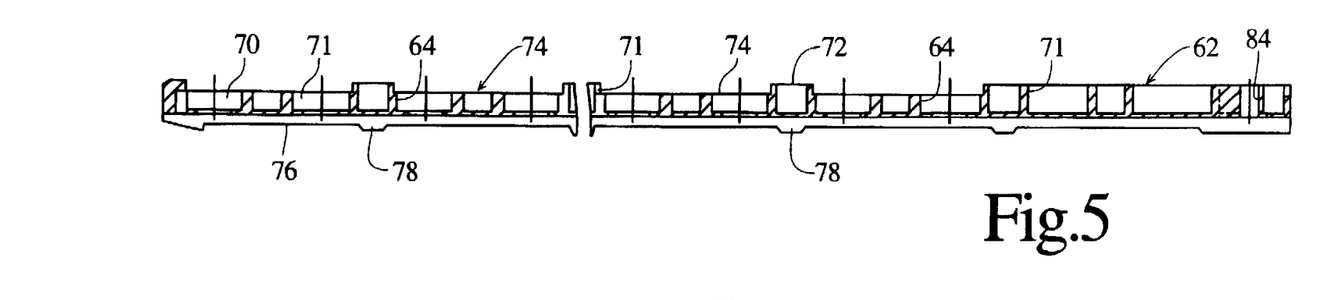
FIG. 5 is a sectional view of the shim tray taken along the line 5—5 of FIG. 4.
Figure 6:
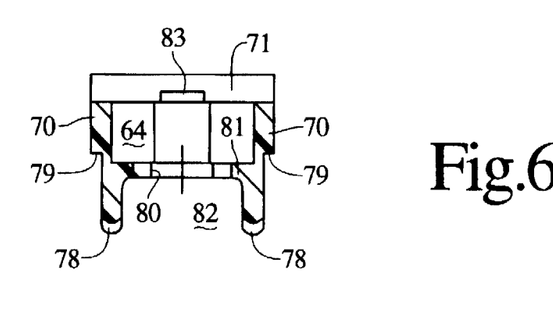
FIG. 6 is a sectional view of the shim tray taken along the line 6—6 of FIG. 4.

Referring now to FIGS. 4–6, each shim tray 62 includes two side walls 70. The side walls define opposing side surfaces of the shim pockets 64. A number of intermediate end walls 71 extend transversely between the side walls 70. The end walls define opposing end surfaces of the shim pockets 64. A contoured upper surface 72 of each side wall defines a number of recesses 74 for receiving the tray covers 68. A contoured lower surface 76 of each side wall 70 defines a number of feet 78 extending downward from the lower surface 76. A shoulder 79 is provided on an outer surface of each side wall.

An aperture 80 extends through a bottom surface 81 of each shim pocket 64. The apertures facilitate removing the shims 66 from the shim pockets by permitting an object, such as a user's finger or a screwdriver, to be inserted into the shim pocket to eject the shim(s) retained therein. The bottom surface 81 cooperates with the side walls 70 to define a passage 82 extending longitudinally along the shim tray 62 beneath the shim pockets 64.

A slot 83 is provided on selective intermediate end walls 71 defining the recesses 74. A bore 84 extends through the shim tray at one end thereof. The bore is adapted to receive a fastener 85 (FIG. 3) for securing the shim tray 62 to the cylindrical member 26 when properly positioned within the bore 12.

The shim tray 62 is preferably formed by compression molding an epoxy/chopped fiberglass composition. Chopped fiberglass is easier to mold and provides an end product with better tolerances relative to shim trays formed from continuous-stranded fiber glass.

Figure 7:
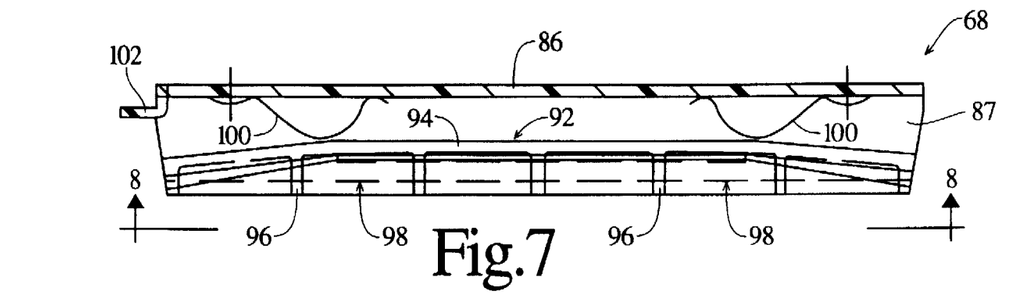
FIG. 7 is a sectional view of a shim tray lid of the shim set taken along the line 7—7 of FIG. 8.
Figure 8:
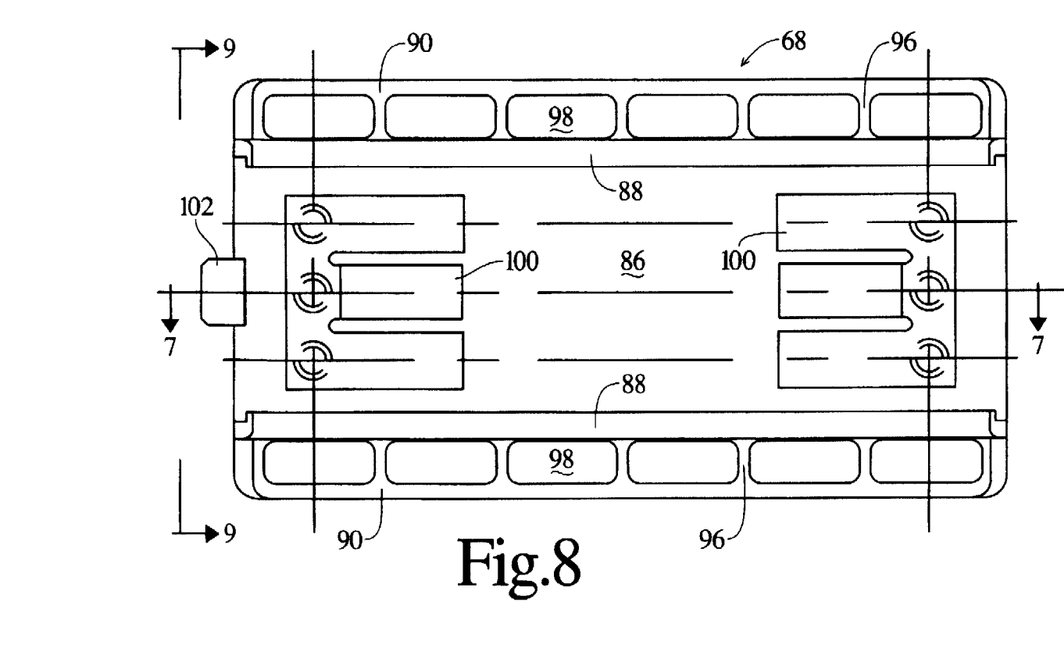
FIG. 8 is a bottom view of the shim tray lid taken along the line 8—8 of FIG. 7.
Figure 9:
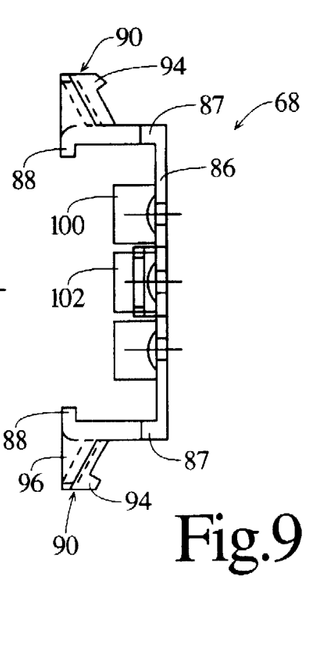
FIG. 9 is an end view of the shim tray lid taken along the line 9—9 of FIG. 8.

Referring now to FIGS. 7–9, the shim tray cover 68 includes an upper surface 86 and two side walls 87 extending from opposing ends of the upper surface. A lip 88 projects inward from a free end of each side wall for engaging the shoulder 79. A flange 90 projects outward from the free end of each side wall. As best seen in FIG. 7, an upper surface 92 of the flanged housing tapers longitudinally in both directions from a central contact surface or shoulder 94. A number of transverse walls 96 secure the upper surface 92 to the side wall 87 thereby defining a number of hollow cavities 98 within each flanged housing.

Two spring members 100 are secured, and preferably heat staked, to the upper surface 86 of the cover 68. When the cover 68 is secured to the shim tray 62, the spring members apply a downward urging force to the shims retained within adjacent shim pockets 64. A tab 102 extends from an end edge of the upper surface 86 to insure that the cover remains secured to the shim tray 62 during installation of the shim tray into a ramped magnet as described further below. The main magnetic field exerts a rotational torque on the shims. The tab 102 is positioned at the end of the shim pocket at which the shim edge is urged upward. The cover 68 may be formed from a plastic material such as ABS plastic.

As mentioned above, the shims 66 compensate for non-uniformities in the primary magnetic field generated by the superconducting magnetic field coils 10. A magnetic resonance imaging system is typically "shimmed" during installation setup procedures to compensate for the non-uniformities in the primary magnetic field. Each shim pocket 64 of a shim tray 62 may contain from zero to several shims 66 depending upon the extent of compensation required.

Once the desired number of shims 66 are inserted into the pockets 64, the pocket is filled with spacers, e.g., plastic shim sized elements 104 and the covers 68 are installed over the recesses 74. In the embodiment being described, a single cover 68 extends over two adjacent pockets 64. However, it should be appreciated that the length of the covers 68 may be varied so as to cover any number of pockets 64 as desired.

The cover 68 is secured to the shim tray 62 by first inserting the cover tab 102 into the slot 83 in the transverse wall 71 defining the tray recess 74. The cover 68 is then urged downward. The cover lips 88 resiliently yield to the tray side walls 70 until the lips 88 lockingly engage the shoulders 79 in a snap-fit arrangement. As the cover 68 is urged downward over the shim tray 62, the springs 100 resiliently abut any shims 66 or spacers positioned in the respective shim pockets 64.

After all of the covers 68 are secured to the shim tray 62, the shim set 60 is mounted in a magnetic resonance imaging apparatus. In particular, one shim set 60 is positioned within each gap 58 defined between the gradient former 46, cylindrical member 26, and two adjacent I-beams 56. A typical MRI system may support 16–32 circumferentially spaced-apart shim sets 60 in the annular area between the inner and outer coils 46, 26.

As the shim sets 60 are urged into the respective gaps 58, the tray feet 78 contact an inner periphery of the cylindrical member 26. In addition, the cover shoulders 94 contact the I-beam flanges 61 thereby urging the feet 78 into abutment with the cylindrical member 26.

Normal installation protocols require shim sets to be installed when the superconducting magnetic field coils 10 are ramped down. If the coils 10 are not ramped down, the shims retained within a shim tray attempt to align with the flux lines generated by the primary magnetic field as the shim set is slidably inserted into the bore 12. The result is that the shims apply a torque to the shim tray covers typically causing the covers to separate from the shim tray.

However, if a shim set 60 of the present invention is inadvertently installed while the magnetic field coils 10 are ramped up, the cover tabs 102 cooperate with the slots 83 to secure the covers 68 to the shim tray 62 against the torque applied by the shims 66. Once the shim set 60 is properly positioned within the bore 12, the fastener 85 is inserted into the bore 84 for attachment to the cylindrical member 26 as shown in FIG. 3.

During state of the art imaging operations, 50 kilowatts of power may be applied to the gradient coil assembly 40. A portion of the $I^2R$ heat generated by the gradient coil assembly during imaging operations flows to the shim sets by conduction through the cylindrical member 26. The heat conducting from the cylindrical member 26 through the shim sets raises the temperature of the shims retained therein.

The dominant effect of increased shim temperatures is to shift or change the center frequency of the primary magnetic field within the imaging volume. It should be appreciated that the primary magnetic field changes or shifts as a whole in response to increased shim temperatures. To a lesser degree increased shim temperatures alter the ability of the shims to compensate for non-uniformities in the primary magnetic field. It is contemplated that an active primary magnetic field shield coil (not shown) may be used to compensate for the overall shift in frequency of the primary magnetic field to due shim temperature increases.

The shim set design limits the deleterious effects of heat conduction on imaging performance by (1) reducing the rate at which the temperature of the shims increases, and (2) reducing the maximum temperature reached by the shims.

Figure 10:
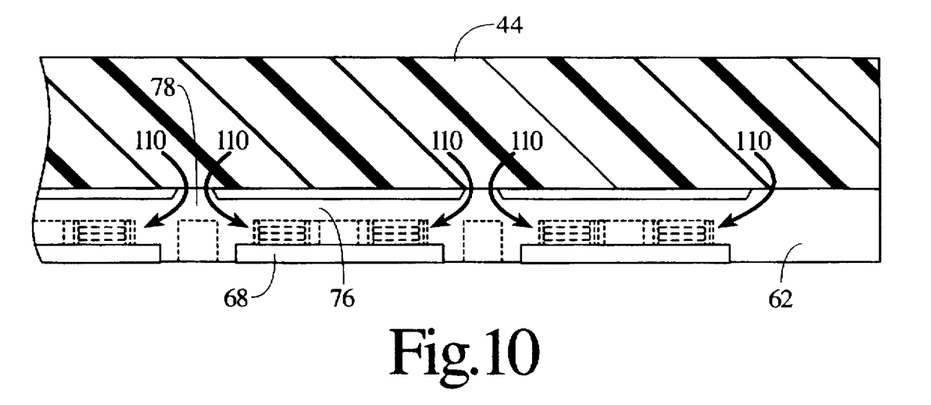
FIG. 10 is a fragmented side view of the shim set and shield gradient coil showing conduction heat paths through the shim set.

In particular, raising the side wall lower edges 76 of the shim tray 62 off the inner periphery of the outer gradient tube 26 facilitates cooling air flow through the passage 82 defined between the outer gradient tube 26 and the shim tray 62. Thus, as shown in FIG. 10, I²R heat (indicated by arrows 110) flows into the shim tray 62 only through the feet 78 abutting the inner periphery of the outer gradient tube 26.

Raising the shim tray lower surface 81 off the outer gradient tube 26 also increases the length of the I²R heat flow paths through the shim tray 62 (i.e. moves the shims as far as possible from the contact areas or feet 78). In the preferred embodiment, a blower (not shown) flows air around the periphery or across the exposed exterior surfaces of the shim set 60 (i.e. through the passage 82 and the passage 58).

Tapering the flange upper contact surfaces 92 of the cover 68 (1) minimizes the contact area (i.e. shoulders 94) between the shim tray cover 68 and the mounting brackets 56, and (2) increases the length of the I²R heat flow paths through the shim tray cover 68 (i.e. moves the shims as far as possible from the contact areas or shoulders 94). Thus, as shown in FIG. 11, I²R heat (indicated by arrows 112) flows into the shim tray cover 68 only through the shoulders 94 abutting the mounting bracket flanges 61.

Reducing the cross section of the shim tray cover 68 (i.e. minimizing the amount of material used to mold the cover by hollowing out the flange 90) reduces the cross section of the heat flow paths through the shim tray cover.

Thus, minimizing the contact areas and cross sections reduces the amount of heat conducted to the shims. Lengthening the heat conduction paths increases the time constant (i.e. the length of time that is takes to heat up the shims). Raising the shim tray off the outer gradient tube and blowing cooling air under as well as over the shim tray doubles the cooling capacity. The combined effect is to reduce substantially the rate of rise of the shim temperature and to reduce substantially the maximum shim temperature. In particular, a 40–50% reduction in the shim steel temperature and the rate of temperature rise, and thus long term stability of the primary magnetic field, is realized.

Figure 11:
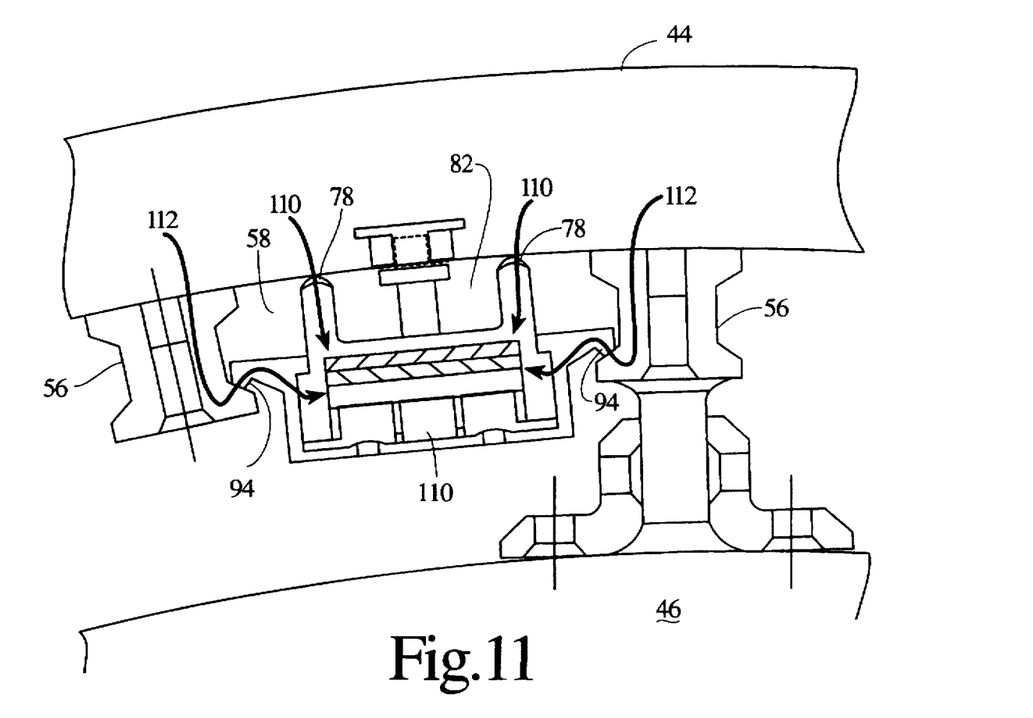
FIG. 11 is a sectional view similar to FIG. 3 showing the conduction heat paths through the shim set.

As shown in FIG. 11, the shim set 60 has four contact points, two on the shim tray (i.e. feet 78) and two on the lid (i.e. shoulders 94). It should be appreciated that reducing the rate of rise of the shim temperature and reducing the maximum shim temperature could be accomplished with more or fewer contact points. For example, the shim set could have one contact point on the tray 62 and one or two contact points on the cover 68. Alternatively, the shim set could have two contact points on the tray and no contact points on the lid, or two contact points on the lid and no contact points on the tray, etc.

It should be appreciated that each contact point must have a minimum surface area to prevent a creep response of the material. As used herein, "creep response" refers to a deformation where a material softens or changes states and then flows when the material is subjected to applied loads at high temperatures. Thus, the contact area of the feet 78 and shoulders 94 is optimized to prevent the material from creeping while at the same time minimizing the heat flow paths therethrough.

Referring again to FIG. 2, the secondary gradient coil 44 includes the cylindrical dielectric member or former 26 which preferably has grooves for receiving a z-gradient shield coil 114. X and y-gradient shield or secondary coils 116, 118 are mounted on the outer circular periphery of the former 26 and potted in epoxy.

The design of the x, y, and z-gradient and gradient shield coils is preferably of the design shown in the above-referenced U.S. Pat. No. 5,296,418. The primary and secondary gradient coils are series connected to create accurate gradient magnetic fields in the bore 12 and canceling magnetic fields outside the bore, particularly in the vacuum vessel. Preferably, an annulus of more than 33 mm is provided between the primary gradient coil former 46 and the cylindrical member 26.

This provides sufficient passage for air cooling, displaces the primary and shield gradient coils a maximal amount, and provides a compartment within which to insert magnetic field shims for shimming the uniformity of the main magnetic field. Preferably, the cylindrical member 26 is connected with other portions of the vacuum vessel 24 with an O-ring joint 120 to maintain the vacuum while providing a solid construction which maximizes the space available for cold shield assemblies therein.

Various alternate embodiments are also contemplated. First, the primary gradient coils may be distributed coils defined by copper or other electrically conductive tubes. By running a cooling fluid through the tubes, greater cooling efficiency is achieved and higher power levels or gradient strengths can be run.

Referring again to FIG. 1, a sequence control 130 controls a gradient coil control 132 and a transmitter 134. The gradient coil control 132 is connected with a series of current pulse generators or current amplifiers 136 which, in turn, are connected with the primary gradient coils 50, 52, 54. Optionally, the secondary gradient coils can be controlled independently and directly by the gradient control 132 rather than being series connected with the primary gradient coil.

The transmitter 134, preferably a digital transmitter, is connected with the radio frequency coil 32 for generating pulses of radio frequency signals for exciting and manipulating magnetic resonance in selected dipoles of a portion of a subject within the bore. A radio frequency receiver 138, preferably a digital receiver, is connected with the radio frequency primary coil or surface coils (not shown) for demodulating magnetic resonance signals emanating from the examined portion of the subject.

An image reconstruction processor 140, such as an inverse two-dimensional Fourier transform reconstruction processor, reconstructs the received magnetic resonance signals into an electronic image representation that is stored in an image memory 142. A video processor 144 converts electronic images stored in the memory 142 into appropriate format for display on a video monitor 146.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A shim set for use in a magnetic resonance imaging apparatus including a main field magnet for generating a temporally constant magnetic field through an examination region, a radio frequency transmitter for exciting and manipulating magnetic resonance in selected dipoles in the examination region, a receiver for demodulating magnetic resonance signals received from the examination region, a processor for reconstructing the demodulated resonance signals into an image representation, and a self-shielded gradient coil assembly including a primary gradient coil and a secondary gradient coil coupled together to cause magnetic field gradients along first, second, and third axes within the examination region and shield at least selected regions outside the examination region from magnetic field gradients, the shim set including:

an elongate shim tray positioned within an annular gap defined between the primary and secondary gradient coils, the shim tray including pockets for retaining shims therein, the pockets being spaced from an inner periphery of the secondary gradient coil to define a cooling passage therebetween; and at least one cover secured to the tray for retaining the shim within the pockets.

2. The shim set of claim 1, wherein the shim tray includes a plurality of spaced feet extending from a lower edge thereof, the feet contacting the inner periphery of the secondary gradient coil.

3. The shim set of claim 1, wherein the cover includes a flange which supports a shoulder portion, the shoulder portion contacting a mounting bracket interposed between the primary and secondary gradient coils.

4. The shim set of claim 1, wherein:

the shim tray includes a plurality of feet extending from a lower edge thereof and contacting the inner periphery of the secondary gradient coil; and the cover includes a shoulder portion which contacts a mounting bracket interposed between the primary and secondary gradient coils.

5. The shim set of claim 1, wherein:

the shim tray further includes a first locking member positioned proximate the pocket; and the cover includes a second locking member which engages with the first locking member when the cover is secured to the shim tray.

6. The shim set of claim 5, wherein the first locking member includes a slot and the second locking member includes a tab.

7. The shim set of claim 1, wherein the tray further includes:

a first side wall spaced apart from a second side wall, the side walls each having an upper surface, an intermediate portion and a lower surface;

a plurality of transverse walls extending between the first and second side walls, the transverse walls each having an end edge;

a plurality of feet extending from the lower surface of each side wall; and a bottom wall joining the end edges of the transverse walls with the intermediate portions of the first and second side walls.

8. The shim set of claim 1, wherein the cover includes an upper surface, a first side wall and a second side wall extending from opposing ends of the upper surface, a pair of flanges each extending remotely from the first and second side walls and having a tapered surface defining a first shoulder, a spring secured to the upper surface for resiliently contacting the shims, and a retainer which cooperates with the shim tray to secure the cover to the shim tray.

9. The shim set of claim 8, wherein the retainer includes:

a tab for engaging with a slot associated with the shim tray; and a pair of opposing lips each extending from a free end of the first and second side walls respectively for engaging with a second shoulder associated with the shim tray.

10. The shim set of claim 1 wherein the shim tray is compression formed from an epoxy/chopped fiberglass material, and the cover is formed from ABS plastic.

11. A magnetic resonance apparatus comprising:

a magnet assembly for generating a temporally constant magnetic field along a longitudinal axis through an examination region, the magnet assembly including a generally cylindrical member which defines a longitudinally extending bore which extends around the examination region;

a radio frequency coil assembly disposed within the bore for transmitting radio frequency pulses into the examination region;

a gradient coil means for causing magnetic field gradients within the bore, the gradient coil means including:

a shield gradient coil assembly supported by the cylindrical member;

a primary gradient coil assembly supported within the first gradient coil assembly;

a shimming assembly supported between the primary gradient coil assembly and the cylindrical member for adjusting the magnetic field through the examination region, the shimming assembly including:

an elongate shim tray positioned within an annular gap defined between the primary and secondary gradient coils, the shim tray including pockets for retaining shims therein, the pockets being spaced from an inner periphery of the shield gradient coil to define a cooling passage therebetween; and a cover secured to the tray for retaining the shim within the pockets.

12. The apparatus of claim 11, wherein the shim tray includes a plurality of spaced feet extending from a lower edge thereof, the feet contacting the inner periphery of the secondary gradient coil.

13. The apparatus of claim 11, wherein the cover includes a flange which supports a shoulder portion, the shoulder portion contacting a mounting bracket interposed between the primary and secondary gradient coils.

14. The apparatus of claim 11, wherein:

the shim tray includes a plurality of feet extending from a lower edge thereof and contacting the inner periphery of the secondary gradient coil, and the cover includes a shoulder portion which contacts a mounting bracket interposed between the primary and secondary gradient coils to urge the cover onto the tray and the feet of the tray against the inner periphery.

15. The apparatus of claim 11, wherein:

the shim tray further includes a first locking member positioned proximate the pocket; and the cover includes a second locking member which engages with the first locking member when the cover is secured to the shim tray.

16. The apparatus of claim 15, wherein the first locking member includes a slot and the second locking member includes a tab.

17. The apparatus of claim 11, wherein the tray further includes:

a first side wall spaced apart from a second side wall, the side walls each having an upper surface, an intermediate portion and a lower surface;

a plurality of transverse walls extending between the first and second side walls, the transverse walls each having an end edge;

a plurality of feet extending from the lower surface of each side wall; and a bottom wall joining the end edges of the transverse walls with the intermediate portions of the first and second side walls.

18. The apparatus of claim 11, wherein the cover includes an upper surface, a first side wall and a second side wall extending from opposing ends of the upper surface, a pair of flanges each extending remotely from the first and second side walls and having a tapered surface defining a first shoulder, a spring secured to the upper surface for resiliently contacting the shim, and a retainer which cooperates with the shim tray to secure the cover to the shim tray.

19. The apparatus of claim 18, wherein the retainer includes:

a tab for engaging with a slot associated with the shim tray; and a pair of opposing lips each extending from a free end of the first and second side walls respectively for engaging with a second shoulder associated with the shim tray.

* * * * *